US008861271B1

(12) United States Patent
Zain et al.

(10) Patent No.: US 8,861,271 B1
(45) Date of Patent: Oct. 14, 2014

(54) HIGH RELIABILITY NON-VOLATILE STATIC RANDOM ACCESS MEMORY DEVICES, METHODS AND SYSTEMS

(75) Inventors: Suhail Zain, San Ramon, CA (US); Helmut Puchner, Santa Clara, CA (US); Walt Anderson, Dublin, CA (US); David Still, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 226 days.

(21) Appl. No.: 13/536,661

(22) Filed: Jun. 28, 2012

Related U.S. Application Data

(60) Provisional application No. 61/612,169, filed on Mar. 16, 2012.

(51) Int. Cl.
*G11C 16/04* (2006.01)

(52) U.S. Cl.
USPC .. 365/185.07; 365/154; 365/156; 365/189.09

(58) Field of Classification Search
USPC ........................ 365/185.07, 154, 156, 189.09
See application file for complete search history.

(56) References Cited

U.S. PATENT DOCUMENTS

| | | | | |
|---|---|---|---|---|
| 6,687,648 | B1 | 2/2004 | Kumar et al. | |
| 6,888,750 | B2 | 5/2005 | Walker et al. | |
| 7,023,740 | B1 | 4/2006 | Wong et al. | |
| 7,045,424 | B2 | 5/2006 | Kim et al. | |
| 7,164,608 | B2 * | 1/2007 | Lee | 365/189.05 |
| 7,385,840 | B2 * | 6/2008 | Redwine | 365/154 |
| 7,430,137 | B2 | 9/2008 | Greene et al. | |
| 7,460,400 | B1 * | 12/2008 | Kikuchi | 365/185.05 |
| 7,564,725 | B2 * | 7/2009 | Houston | 365/189.09 |
| 7,724,565 | B2 * | 5/2010 | Barth et al. | 365/154 |
| 7,768,317 | B1 | 8/2010 | Dhaoui et al. | |
| 7,944,724 | B2 * | 5/2011 | Chu | 365/49.17 |
| 8,339,838 | B2 * | 12/2012 | Ramaraju | 365/154 |
| 2003/0155605 | A1 | 8/2003 | Jong et al. | |
| 2009/0059675 | A1 | 3/2009 | Smith et al. | |
| 2010/0044768 | A1 | 2/2010 | Sadd et al. | |

OTHER PUBLICATIONS

Adams et al., SONOS Nonvolatile Semiconductor Memories for Space and Military Applications, 2001 Aerospace Conference, IEEE Proceedings, pp. 2295-2300, vol. 5, 2001.
Derbenwick et al., SONOS Nonvolatile Shadow RAMs for Space Applications, Non-Volatile Memory Technology Symposium 2000: Proceedings, Nov. 1, 2000, pp. 57-59.
White et al., Abstract of "On the go with SONOS", IEEE Circuits and Devices Magazine, Jul. 2000, vol. 16, Issue 4, pp. 22-31, Internet: http://ieeexplore.ieee.org/xpl/articleDetails.jsp?arnumber=857747.
Williams et al., Abstract of "Radiation hardened 64 K / 256 K EEPROM technology", Sixth Biennial IEEE International Nonvolatile Memory Technology Conference 1996, Jun. 24-26, 1996, pp. 67-70, http://ieeexplore.ieee.org/xpl/articleDetails.jsp?arnumber=534671.

* cited by examiner

*Primary Examiner* — Pho M Luu

(57) ABSTRACT

A device can include a plurality of memory cells, each memory cell including at least one latch circuit coupled between two data nodes, a first nonvolatile section coupled to a first data node, and a second nonvolatile section coupled to a second data node; and each nonvolatile section including at least one switch element in series with a programmable non-volatile element, the switch element configured to couple the nonvolatile element to the corresponding data node during a high reliability read operation of the memory cell.

20 Claims, 9 Drawing Sheets

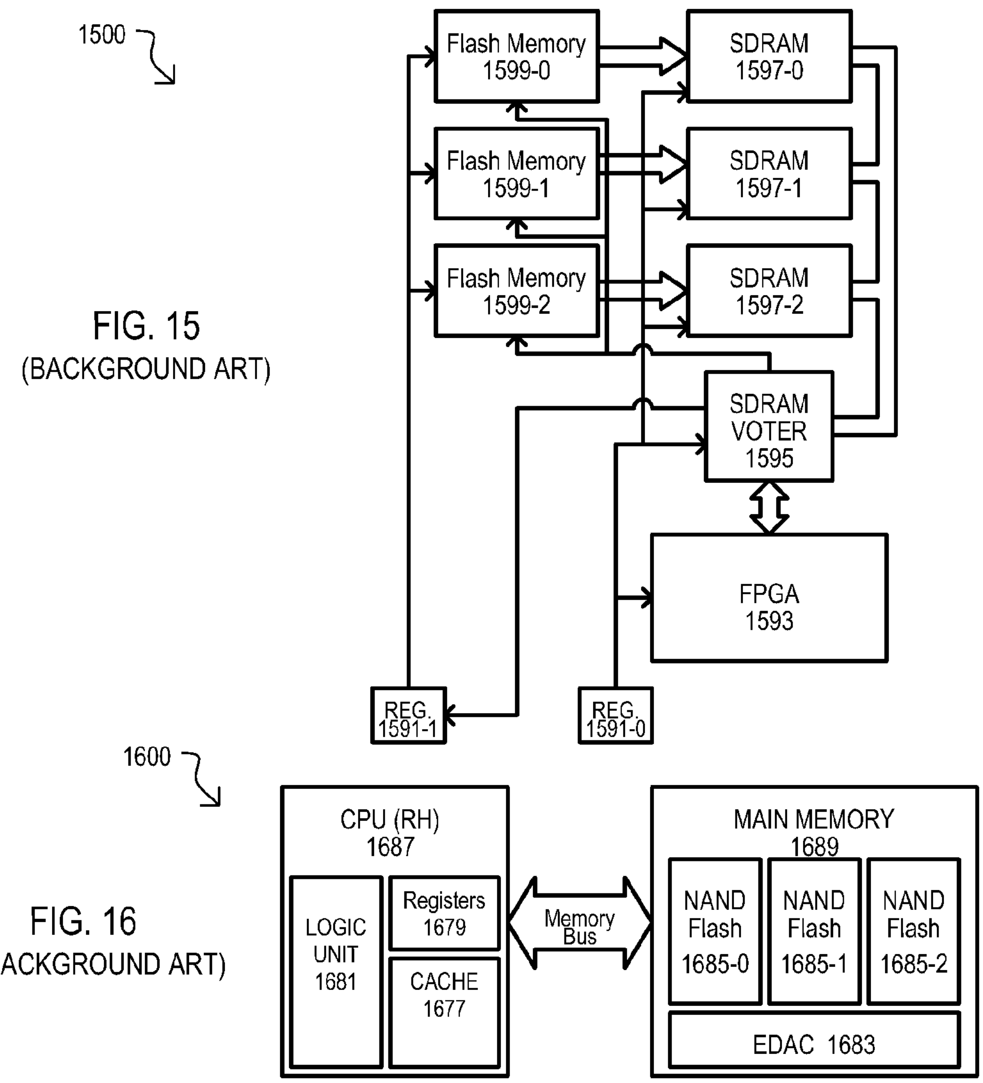
FIG. 15
(BACKGROUND ART)
FIG. 16
(BACKGROUND ART)
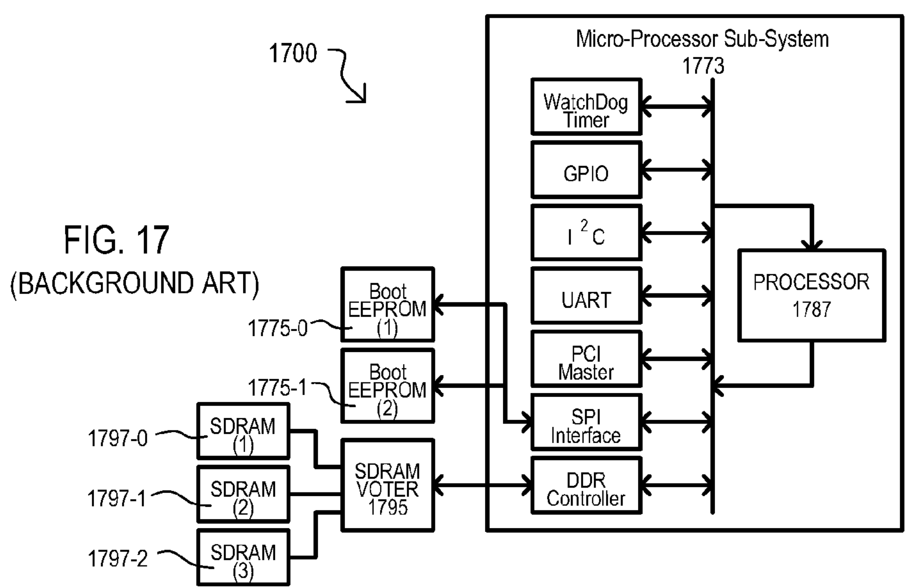
FIG. 17
(BACKGROUND ART)

HIGH RELIABILITY NON-VOLATILE STATIC RANDOM ACCESS MEMORY DEVICES, METHODS AND SYSTEMS

This application claims the benefit of U.S. provisional patent application Ser. No. 61/612,169 filed on Mar. 16, 2012, the contents of which are incorporated by reference herein.

TECHNICAL FIELD

The present disclosure relates generally to memory devices, and more particularly to high reliability memory devices, such as radiation hardened devices, and the like.

BACKGROUND

Electronic systems can be employed in environments having higher reliability requirements than typical industrial applications. For example, some applications require an integrated circuit be "radiation hardened" (rad hard) with respect to ionizing radiation. One such application can be space applications. In many space applications there is an increasing demand for data processing and throughput along with reconfigurability for flexibility. Accordingly, field programmable gate arrays (FPGAs) are enjoying increased use in radiation challenged environments. In such applications, systems require some type of nonvolatile memory to store configuration data for configuring (and if necessary reconfiguring) the FPGA. Further, centralized processing in satellites has placed a higher demand on more capable processors and multitasking, leading to larger non-volatile storage requirements (such as 64 Mbits and higher).

One conventional space system non-volatile memory solution can use commercially screened "flash" electrically erasable read only memory (EEPROM) in combination with synchronous dynamic random access memory (SDRAM), operating as a "shadow" memory, storing data from flash memory for fast access by a processor/programmable logic device. Data stored in nonvolatile devices can include processor boot code and/or configuration data for an FPGA, or the like. A drawback to such conventional approaches is that they can be size, weight and power intensive solutions, all of which are undesirable, particularly in space applications.

A conventional system is shown in FIG. 15 and designated by the general reference character 1500. A system 1500 can include commercially screened NOR type flash integrated circuit (IC) devices 1599-0 to -2, for storing data in a non-volatile fashion. Such nonvolatile data can be loaded into commercially screened SDRAM devices 1597-0 to -2. Flash devices (1599-0 to -2) can be powered down once data is loaded into the SDRAM devices (1597-0 to -2) for an improved total ionizing dose response.

In the system shown, flash devices (1599-0 to -2) and SDRAMs (1597-0 to -2) have a triple module redundancy (TMR) configuration, replicating data across three devices. An SDRAM voter 1595 can determine a read data value based on data from three different data paths.

Data from SDRAM voter 1595 can be provided to an FPGA 1593 device, and can include configuration data and/or instruction data (for a processing circuit embedded in, or created by programming the FPGA 1593).

Voltage regulators 1591-0/1 can regulate supply voltages to the various devices of the system 1500.

In some conventional systems, system storage can be capable of storing up to several gigabytes of data. One example of a high data storage system is shown in FIG. 16. A system 1600 can include a main memory 1689 and a radiation hardened processor 1687. A main memory 1689 can typically use up-screened commercially available NAND flash devices (1685-0 to -2) employing TMR techniques. Further, a complex error detection and correction (EDAC) circuit 1683 can be included to improve the reliability of data access operations.

A processor 1687 can include a logic unit 1681, registers 1679 and a cache memory 1677. In a conventional system like that of FIG. 16, one estimate places 50% of the memory used (not including logic) in overhead to maintain the aforementioned TMR and EDAC. While total radiation dose issues on commercial devices can be mitigated through shielding, such solutions can also be costly and/or increase weight.

In many high reliability systems, processors can require instruction and data sequences (code) to implement a desired functionality. Such code not only initializes the firmware (Interfaces), but can also provide the correct execution sequence to perform the various tasks desired from the processor system. One example of a conventional high reliability (e.g., rad hard) processor system is shown as 1700 in FIG. 17.

A system 1700 can include a processor subsystem 1773 having a processor 1787 can various other circuits and/or interfaces. The conventional system 1700 of FIG. 17 shows a watch dog timer, general purpose input/outputs (GPIO), serial interfaces (i.e., $I^2C$, UART, SPI), a parallel interface (PCI master), and a parallel memory interface (DDR controller). SPI interface can be connected to two boot EEPROMs 1775-0/1. DDR controller can be connected to SDRAM voter 1795. SDRAM voter 1795 provides data from TMR configured SDRAM devices 1797-0 to -2. EEPROMs (1775-0/1) can be radiation hardened devices that store code for the processor sub-system 1773, and thus can be costly. Further, multiple EEPROM devices are needed since high reliability EEPROM density is can be relatively small (i.e., about ~20 Mbit) as compared to commercial devices.

BRIEF DESCRIPTION OF THE DRAWINGS

FIG. 15 is a block diagram of a conventional radiation hardened (rad hard) system.

FIG. 16 is a block diagram of another conventional rad hard system.

FIG. 17 is a block diagram of a conventional rad hard processor system.

DETAILED DESCRIPTION

Figure 1A:
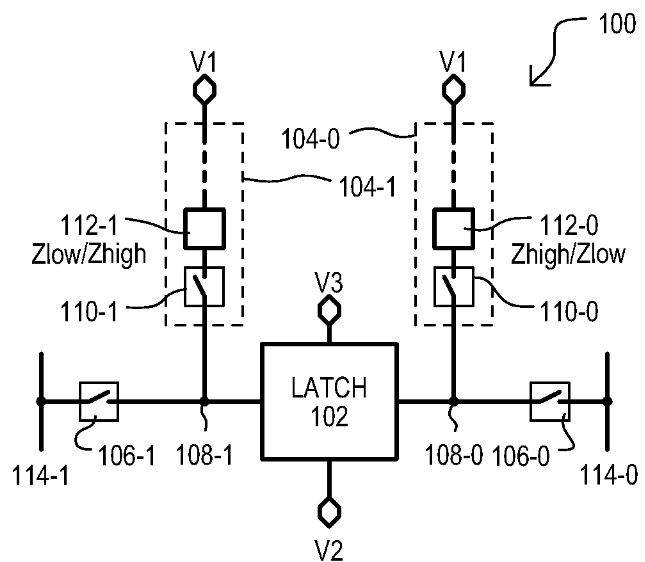
FIGS. 1A and 1B are block schematic diagrams of a non-volatile static random access memory (NVSRAM) cell and operations according to embodiments.

Various embodiments will now be described that include high reliability (e.g., radiation hardened) memory devices, systems and methods, that can store large amounts of data with a substantially smaller footprint than conventional systems, like those described above.

Embodiments can include nonvolatile static random access memory (NVSRAM) cells that can be placed into a "hardened" mode. In a hardened mode, nonvolatile elements can maintain latch nodes at stored data values during a read operation by biasing nonvolatile sections connected to the latch nodes, for a high reliability read operation. In some embodiments, such nonvolatile elements can be semiconductor-oxide-nitride-oxide-semiconductor (SONOS) type transistors.

In the embodiments below, like sections are referred to with the same reference character but with the leading digit(s) corresponding to the figure number.

Figure 1B:
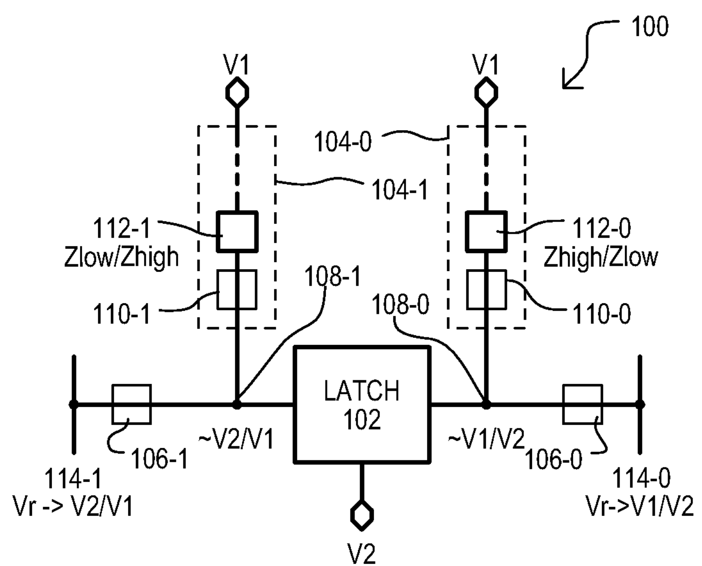

FIGS. 1A and 1B show a NVSRAM memory cell 100 according to an embodiment. Memory cell 100 can include a latch 102, a first nonvolatile section 104-0, a second nonvolatile section 104-1, a first access device 106-0 and a second access device 106-1. A latch 102 can latch a data value by driving a first data node 108-0 and a second data node 108-1 to complementary values. In the embodiment shown, a latch 102 can be connected between power supply voltages V2 and V3.

A first nonvolatile section 104-0 can be connected between first data node 108-0 and a supply voltage V1. Similarly, a second nonvolatile section 104-1 can be connected between second data node 108-1 and supply voltage V1. Each nonvolatile section 104-0/1 can include a switch device 110-0/1 and nonvolatile element 112-0/1 arranged in series with one another. Switch devices 110-0/1 can be switched between high and low impedance values. Nonvolatile elements 112-0/1 can be programmed to opposing impedance values (e.g., Zlow/Zhigh).

Access devices 106-0/1 can connect first and second data nodes 108-0/1 to bit lines (BL/BLB) 114-0/1, respectively, to enable data to be read out from memory cell 100.

FIG. 1A shows a memory cell 100 in a standard state. Latch 102 can maintain data nodes 106-0/1 at complementary values (e.g., ~V3/~V2) established by nonvolatile elements 112-0/1. Switch devices 110-0/1 can isolate nonvolatile elements 112-0/1 from data nodes 108-0/1.

FIG. 1B shows a memory cell 100 in a high reliability read operation. Unlike some NVSRAM read operations, which isolate nonvolatile elements from data nodes 108-0/1, in the high reliability read operation, switch devices 110-0/1 can be in a low impedance state, connecting nonvolatile elements 112-0/1 to data nodes 108-0/1, respectively. In such an arrangement, one of nonvolatile sections 104-0/1 can bias its data node, to thereby reinforce the state of the latch 102. In particular, such reinforcement can make a latch state resistant to single event upset, such as that caused by ionizing radiation, or the like.

In the high reliability read operation, access devices 106-0/1 can be enabled, connecting data nodes 108-0/1 to bit lines 114-0/1, respectively, providing a differential data signal reflecting a stored data value.

Referring still to FIG. 1B, a memory cell 100 can have a high reliability standby state. In such a state, a memory cell 100 can be biased as shown in FIG. 1B, but access devices 106-0/1 can be disabled, isolating the data nodes 108-0/1 from the bit lines 114-0/1.

It is understood that while FIGS. 1A and 1B show a memory cell coupled between two bit lines, in an alternate embodiment there can be only one access device and bit line (i.e., the memory cell is "single-ended).

Figure 2:
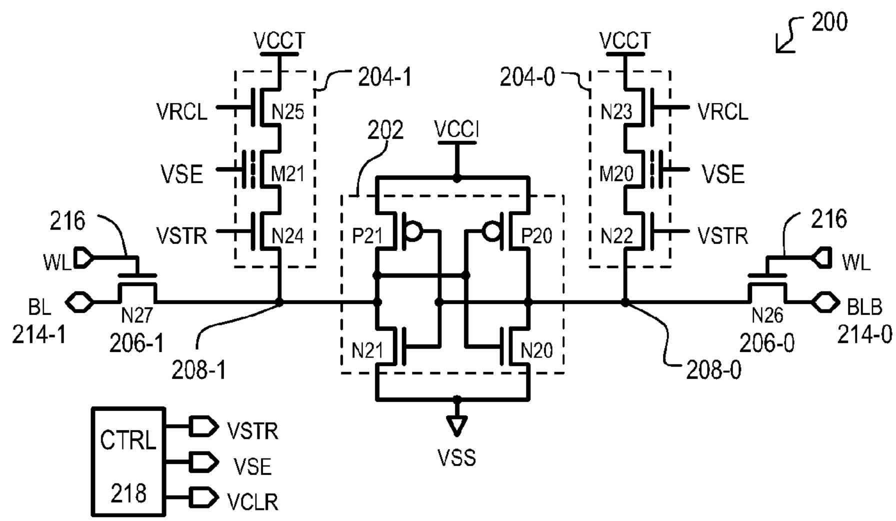
FIG. 2 is a block schematic diagram of a NVSRAM cell according to another embodiment.

Referring to FIG. 2, an NVSRAM according to another embodiment is shown in a schematic diagram and designated by the general reference character 200. Memory cell 200 can include sections like those of FIGS. 1A/B, and in a very particular embodiment, can be one implementation of that shown in FIGS. 1A/B.

FIG. 2 differs from FIGS. 1A/B in that it shows a latch 202 formed by cross-coupled n-channel insulated gate field effect (e.g., MOS) transistors N20/N21 and p-channel MOS transistors P20/P21. In the cross-coupled configuration the drain of one transistor in a pair (i.e., N20/N21 or P20/P21) can be connected to the gate of the other transistor in the pair. Drains of transistors P20/P21 can be connected to a first high power supply voltage VCCI. Drains of transistors N20/N21 can be connected to a low power supply voltage VSS. Accordingly, latch 202 can drive data nodes 208-0/1 to complementary data values (i.e., one at VCCI, the other at VSS).

Nonvolatile sections 204-0/1 can each include first n-channel switch transistors N22/N24, an n-channel SONOS type transistor M20/M21, and a second switch transistor N23/N25, arranged in series with one another between a data node 208-0/1 and a supply voltage node VCCT. First switch transistors N22/N24 can receive a control signal VSTR at their gates. SONOS type transistors M20/M21 can receive a control signal VSE at their gates. Second switch transistors N23/N25 can receive a control signal VCLR at their gates. SONOS type transistors M20/M21 provide nonvolatile storage based on a programmed threshold voltage.

Access devices 206-0/1 can be n-channel transistors N26/N27 have gates commonly connected to a word line 216.

A control circuit 218 can generate control signals VSTR, VSE and VCLR as will be described in more detail below.

FIGS. 3A to 3F show various operations for memory cell 200 of FIG. 2.

Figure 3A:
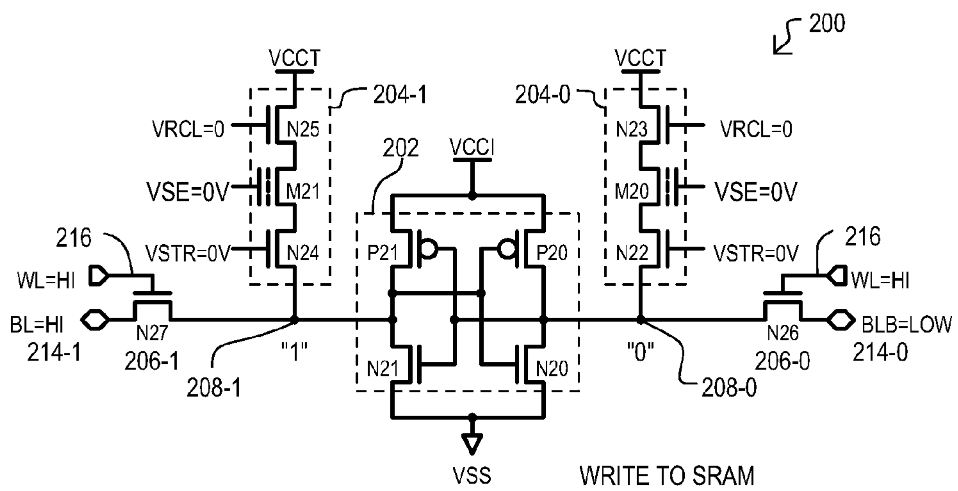
FIGS. 3A to 3F are block schematic diagrams showing the operation of an NVSRAM cell like that of FIG. 2.

FIG. 3A shows a write operation according to an embodiment. In the write operation, a data value can be written into latch circuit 202 while nonvolatile sections 204-0/1 are disabled.

Control signals VSTR, VSE and VCLR can be low (0V in this example), turning off transistors of nonvolatile sections 204-0/1, thus isolating data nodes 208-0/1 from supply voltage node VCCT. Bit lines 214-0/1 can be driven to opposing voltages (in the example shown, BL=HI, BLB=LOW). Word line 216 can be activated, turning on access transistors N26/N27. As a result, latch 202 can store a data value of "1" by latching data node 208-0 at a low voltage (e.g., VSS) and data node 208-1 at a high voltage (e.g., VCCI).

Figure 3B:
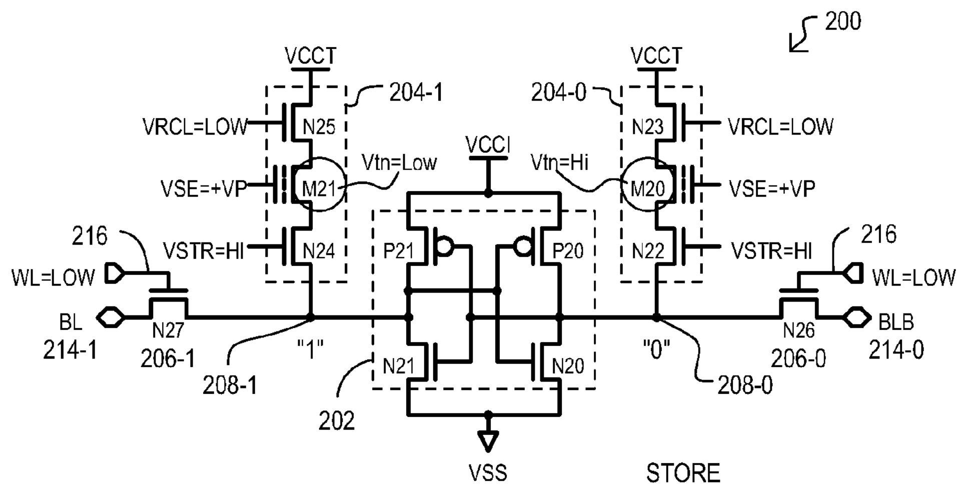

FIG. 3B shows a store operation according to an embodiment. In a store operation, nonvolatile elements (in this embodiment, SONOS type transistors M20/M21) can be programmed to impedance states based on the data value stored by latch circuit 202.

Word line 216 can be disabled, turning off access transistors N26/N27 to isolate data nodes 208-0/1 from bit lines 214-0-0/1

Control signal VSTR can be high, enabling first switch transistors N22/N24. Control signal VSE can be driven to a programming voltage (+VP). Control signal VRCL can be low, turning off second switch transistors N23/N25. As shown, in such an arrangement, SONOS type transistor M20 can be programmed to a relatively high threshold voltage (Vtn=Hi), while SONOS type transistor M21 can be programmed to a relatively low threshold voltage (Vtn=Low). It is understood that SONOS type transistors M20/M21 would be programmed to the opposite threshold voltages if nodes 208-0/1 stored the opposite value.

Figure 3C:
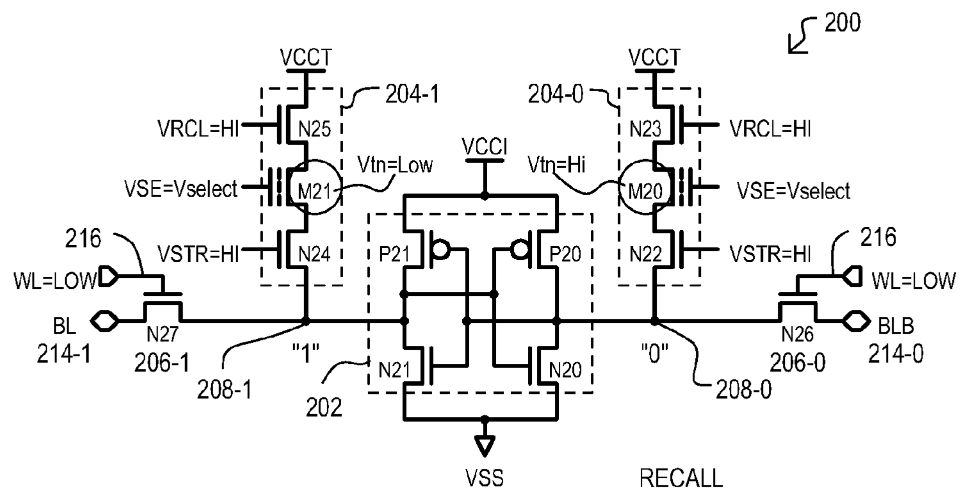

FIG. 3C shows a recall operation according to an embodiment. In a recall operation, the data value stored by latch circuit 202 can be established by states of the programmed SONOS type transistors M20/M21.

Word line 216 can be disabled, turning off access transistors N26/N27 to isolate data nodes 208-0/1 from bit lines 214-0-0/1.

Control signal VSTR can be high, enabling first switch transistors N22/N24. Control signal VRCL can be high, enabling second switch transistors N23/N25. Control signal VSE can be driven to a select voltage (Vselect). In response to a select voltage, a SONOS type transistor M20 with a high threshold voltage (in this example M20) can remain substantially off, isolating the corresponding data node (i.e., 208-0) from a high voltage VCCT. In contrast, a SONOS type transistor M21 with a low threshold voltage (in this example M21) can be turned on, providing a current path between the corresponding data node (i.e., 208-1) and the high voltage VCCT. If latch 202 is not already in such a state, such an action can cause latch 202 to latch data node 208-1 high and data node 208-0 low. In one very particular embodiment, a SONOS device select voltage (Vselect) can be zero volts, a high SONOS type transistor threshold voltage (i.e., Vtn=Hi) can be +2.5 volts, and a low SONOS type transistor threshold voltage (i.e., Vtn=Low) can be −1.5 volts.

It is understood that a recall operation that immediately follows a store operation can be redundant, as the latch will still store the data established by the SONOS type transistors.

Figure 3D:
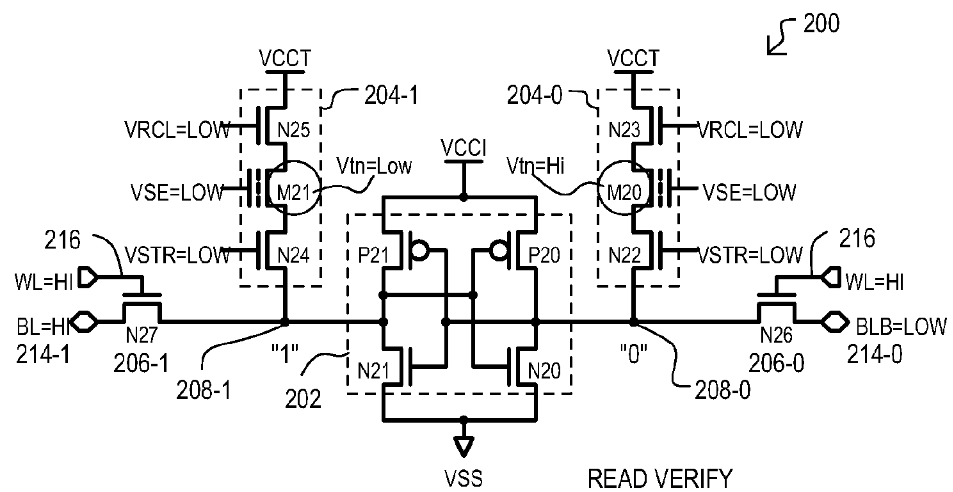

FIG. 3D shows a read verify operation according to an embodiment. In a read verify operation, a data value stored by latch 202 in response to a recall operation can be read out to ensure a store operation has been successful. A read verify operation can be the same as a standard read operation.

In a read verify operation, control signals VSTR, VSE and VCLR can all be low, isolating data nodes 208-0/1 from voltage VCCT.

Word line 216 can be enabled, turning on access transistors N26/N27 to connect data nodes 208-0/1 to bit lines 214-0-0/1. Voltage levels latched on data nodes 208-0/1 can create a differential voltage on bit lines 214-0/1 representative of the verified data value. Such a data value can be compared to the data value written for the store operation to verify proper programming of SONOS type devices M20/M21.

Figure 3E:
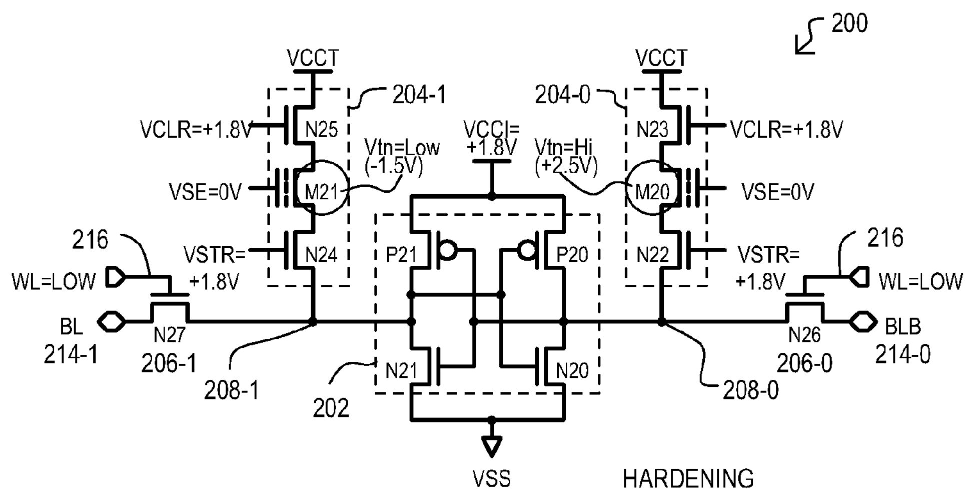

FIG. 3E shows a hardening operation according to an embodiment. In a hardening operation, a memory cell 200 can be placed into a state that can be highly resistant to upset events, to enable more reliable storage of data values and/or reading of data values.

Word line 216 can be disabled, turning off access transistors N26/N27 to isolate data nodes 208-0/1 from bit lines 214-0-0/1.

Control signals VSTR and VRCL can be high, enabling first and second switch transistors N22/N24, N23/N25. Control signal VSE can be driven to a select voltage (Vselect). In the very particular embodiment shown, VSTR=VRCL=VCCT=1.8V, while VSE can be 0V. In such a state, the nonvolatile section having a SONOS element with a low threshold voltage (in the example shown 204-1), can bias its data node (208-1) at a high voltage ("1") by providing a current path to VCCT. In contrast, the nonvolatile section having a SONOS element with a high threshold voltage (in the example shown, 204-0) can isolate its data node (208-0) from VCCT.

In a hardened state, as shown in FIG. 3E, nonvolatile sections 204-0/1 can act as current leaker devices in the occurrence of an upset event. As but one example, when a node (e.g., 208-1) storing a logic high experiences a particle hit, conventionally, the node could discharge, potentially losing a stored data state. However, in the embodiment shown, in the event of such a hit, nonvolatile section 204-1 can act as a current leaker, maintaining the node at a high logic level.

It is also noted that nonvolatile sections 204-0/1 can increase a capacitance at data nodes 208-0/1, increasing the stability of the memory cell 200.

Figure 3F:
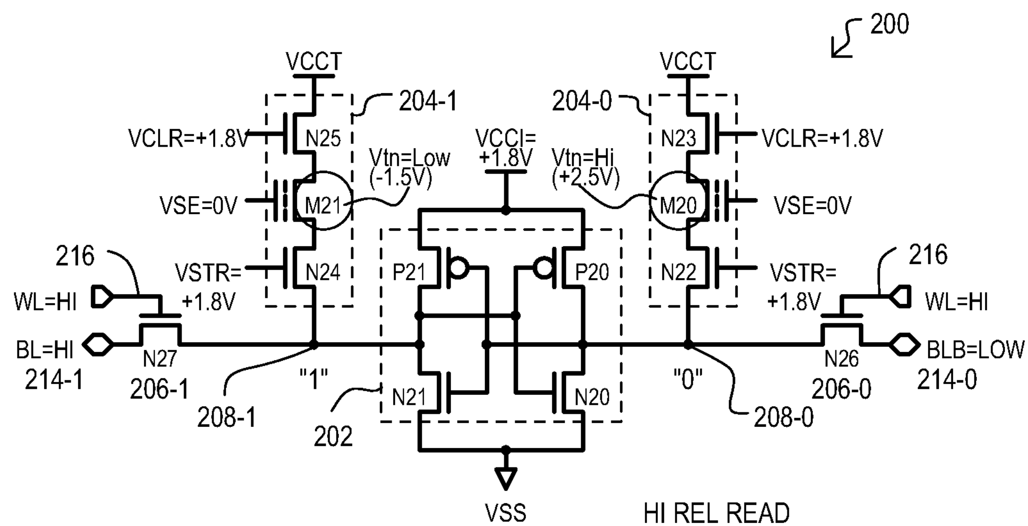

FIG. 3F shows a high reliability read operation according to an embodiment. In a high reliability read operation, a data value stored by latch 202 and maintained/stabilized by nonvolatile sections 204-0/1 can be read out.

In the high reliability read operation, control signals VSTR, VSE and VCLR can have the values noted for the hardening operation shown in FIG. 3E. Word line 216 can be enabled, turning on access transistors N26/N27 to connect data nodes 208-0/1 to bit lines 214-0-0/1. Voltage levels latched/maintained on data nodes 208-0/1 can create a differential voltage on bit lines 214-0/1 representative of the verified data value.

In some embodiments, a memory cell 200 can provide both high reliability read operations, as well as standard read operations. In such embodiments, to switch from high reliability read operations to standard read operations, signals VSTR/VSE/VCLR can return to those values shown in FIG. 3D. A standard read operation can then occur as shown in FIG. 3D.

In a particular embodiment, to make NVSRAM cell 200 radiation hardened, VSTR/VRCL/VCCT are not driven high until after a store operation and recall operation have been done to ensure that the nonvolatile elements (M20/M21) have the same state as the latch 202. A hardening operation can then occur, which will drive these signals to the proper voltages (VSTR=VRCL=VCCT=1.8V, VSE=0V, in one very particular embodiment). As noted above, in particular embodiments, another operation "hardening off" can be included to return such signals to standard levels (e.g., low).

In a very particular embodiment, an NVSRAM device can include cells like those shown in FIG. 2, and can perform the following operations:

Write to the SRAM (as shown in FIG. 3A, or an equivalent);

a Store operation (as shown in FIG. 3B, or an equivalent);

a Recall (as shown in FIG. 3C, or an equivalent, again this can be an optional step as once a store operation is performed, the nonvolatile elements M20/M21 will have the same state as latch 202);

a Read verify operation (as shown in FIG. 3D, or an equivalent);

a Hardening operation (as shown in FIG. 3E, or an equivalent);

a waiting operation to enable voltage levels of signals VSTR/VRCL/VSE/VTT to settle (which can be about 100 μs in one embodiment).

The NVSRAM can then be ready for a high reliability read (as shown in FIG. 3F, or an equivalent).

Figure 4A:
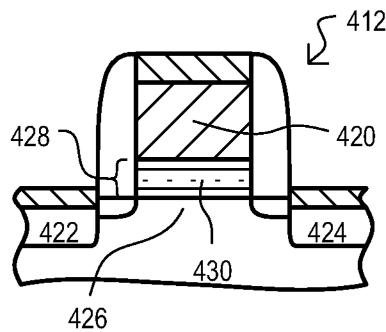
FIGS. 4A and 4B are side cross sectional views of a semiconductor-oxide-nitride-oxide-semiconductor (SONOS) type transistor that can be included in embodiments.
Figure 4B:
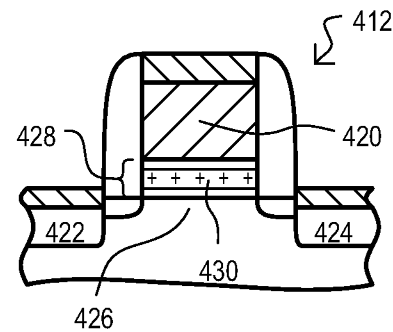

FIGS. 4A and 4B show a SONOS type transistor 412 according to an embodiment. A SONOS type transistor 412 can include a control gate 420, a source region 422, a drain region 424, and a channel region 426. A control gate 420 can be separated from a channel region 426 by a programmable dielectric 428. A programmable dielectric 428 can include one or more charge storing dielectric layers (one shown as 430) from capturing charge, and thus altering a threshold voltage of the SONOS type transistor 412. In the particular embodiment shown, SONOS type transistor 412 can be an n-channel transistor, but other embodiments can include p-channel SONOS type transistors.

It is understood that in some embodiments, a control gate 420 can be formed from a semiconductor material and programmable dielectric 428 can include a silicon nitride layer sandwiched between silicon oxide layers (i.e., ONO). However, in other embodiments, SONOS type transistor may include different type of insulating charge storing layers, and a control gate may be formed from a conductive material that is not a semiconductor.

FIG. 4A represents a SONOS type transistor 412 programmed to a high threshold voltage. Negative charge can be stored in charge storing layer 430.

FIG. 4B represents a SONOS type transistor 412 programmed to a low threshold voltage. Positive charge can be stored in charge storing layer 430.

Figure 4C:
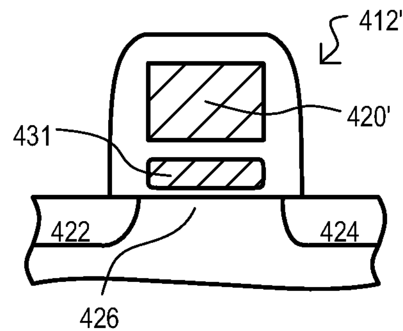
FIG. 4C is a side cross sectional view of a floating gate type transistor that can be included in embodiments.

FIG. 4C shows a floating gate type transistor 412' that can be included in embodiments as a nonvolatile element. A floating gate type transistor 412' can include a control gate 420' a source region 422, a drain region 424, and a channel region 426. A floating gate 431 can be formed between a control gate 420' and the channel region 426. A floating gate 431 can be formed from a conductive/semiconductive material, and can be electrically isolated (i.e., floating). Charge can be placed on, and removed from, the floating gate 431 to vary a threshold voltage of the transistor 412'.

Figure 5:
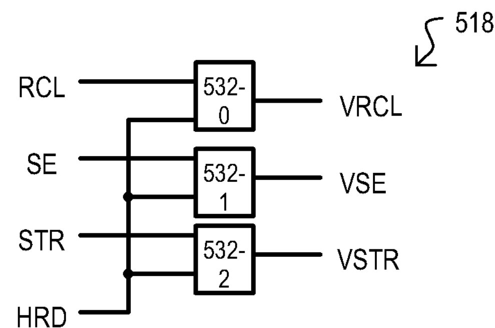
FIG. 5 is a block schematic diagram of a control circuit that can be included in embodiments.

FIG. 5 shows harden control logic 518 that can be included in the embodiments. Harden control logic 518 can drive control signals for nonvolatile sections, to enable such sections (enable nonvolatile elements to maintain latched data node values). In the very particular embodiment shown, control logic 518 can receive control signals RCL, SE, STR, HRD and can output nonvolatile section control signals VRCL, VSE and VSTR (as shown in FIG. 2).

In some modes of operation (i.e., Store, Recall, Standard Read), mode signal HRD can be inactive, and signals VRCL, VSE and VSTR can be driven separately, according to signals RCL, SE and STR, respectively. However, in a hardened mode of operation, HRD can be active, and signals VRCL, VSE and VSTR can be driven to predetermined values to enable the hardened mode of operation (e.g., VRCL=HI, VSE=LOW, VSTR=HI) by operation of logic circuits 532-0 to -2.

While FIG. 5 shows logic for driving control signals of nonvolatile sections, in other embodiments, such signals can be controlled with commands. That is, the levels of any or all of control signals VRCL, VSE or VSTR can be established by commands input to a memory device.

Figure 6:
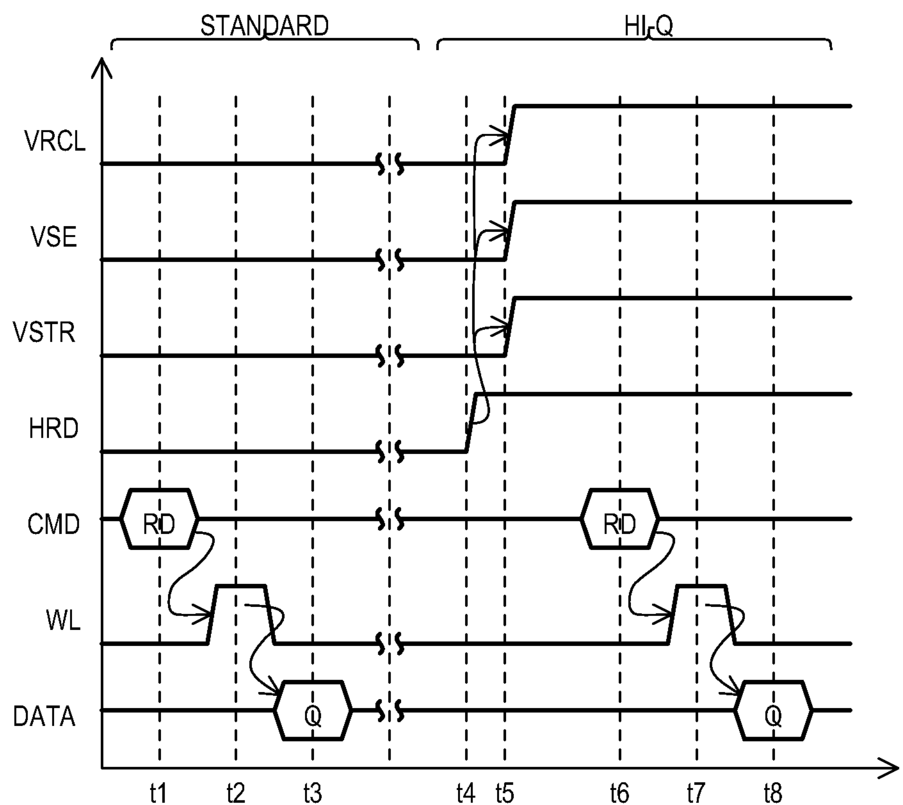
FIG. 6 is a timing diagram showing operations of a memory device according to an embodiment.

FIG. 6 is a timing diagram showing different read modes of operation of a memory device according to one embodiment. FIG. 6 shows control signals for a memory device having memory cells like that of FIG. 2. FIG. 6 shows a standard read operation and a high reliability (Hi-Q) read operation.

Waveforms VRCL, VSE and VSTR show control signals for nonvolatile sections as shown in FIG. 2. Waveform HRD indicates a selection between a standard mode and a hardened mode of operation. Waveform CMD shows command inputs to a memory device. Waveform WL shows a word line response for a group of accessed NVSRAM cells. Waveform DATA shows read data output from the memory device.

A standard read operation will first be described.

Referring to FIG. 6, prior to time t1, control signals VRCL, VSE, VSTR can be inactive (low in this example), disabling nonvolatile sections of NVSRAM memory cells.

At about time t1, input signals to a memory device can indicate a read command. It is understood that address information can also have been received indicating which NVSRAM cells are to be read.

At about time t2, in response to the read command and address data, a word line can be activated, generating data signals on bit lines according to the state of latches within the NVSRAM cells. In such a standard read operation, nonvolatile elements remain disconnected from latch data nodes.

At about time t3, signals on bit lines can be amplified. In some embodiments, column decoding can take place to select data values for output. Output data values (Q) can be driven on outputs of the memory device.

A high reliability read operation will now be described.

At about time t4, a hardened (e.g., high reliability) mode of operation can be indicated (by HRD transitioning high). In some embodiments, a memory device can include one or more particular inputs to indicate a high reliability read operation. In other embodiments, signals VRCL/VSE/VSTR can be activated individually via one or more commands.

At about time t5, in response to entering the hardened mode, control signals VRCL/VSE/VSTR can be driven to active levels (high in this embodiment). As noted above, in some embodiments a settling time can be enforced between entering the hardened mode and reception of a read command. In the hardened mode, nonvolatile sections can bias latch data nodes according to the state of nonvolatile elements, as described herein and equivalents.

At time t6 to t8, a read operation can occur, as noted for times t1 to t3. However, unlike the standard read operation, nonvolatile sections are hardened with biasing through nonvolatile sections, making the latched data node values highly resistant to upset events, such as particle radiation hits, and the like.

Hardening operations, as described herein, can occur in a global fashion (i.e., all memory cells of an array are placed in the hardened state), or can be addressed based (i.e., hardening can occur based on a bank or row containing an address to be accessed). One particular memory device that can harden a memory cells on a group wise basis is shown in FIG. 7.

Figure 7:
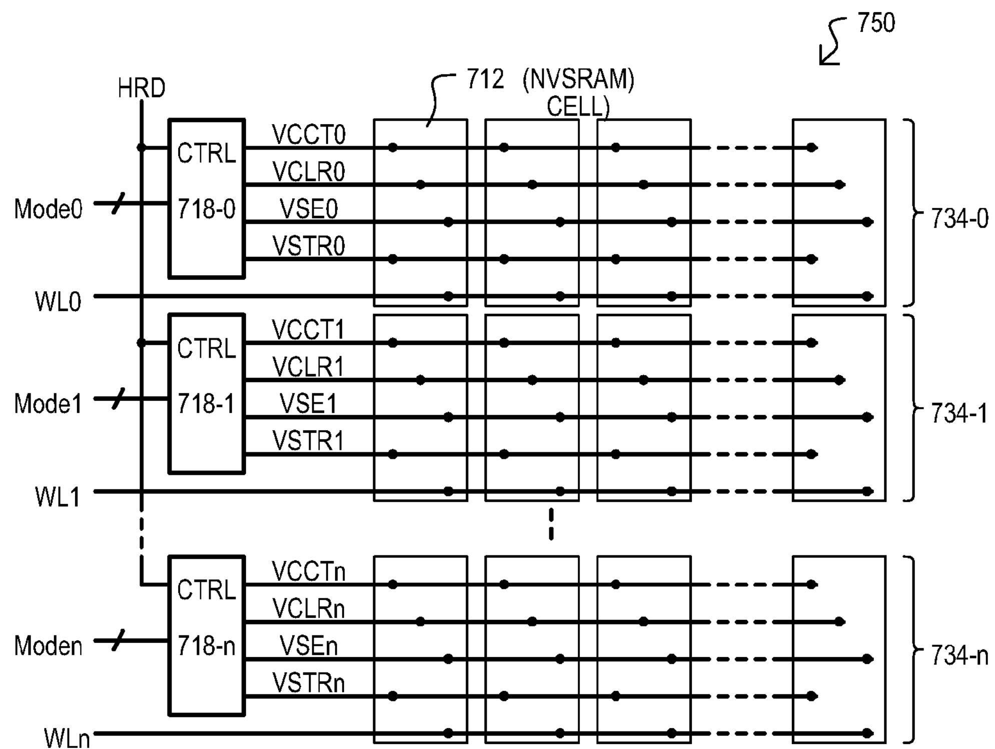
FIG. 7 is a block schematic diagram of a memory device according to an embodiment.

FIG. 7 shows a memory device 750 having an array of NVSRAM cells (one shown as 712). NVSRAM cells (e.g., 712) can be arranged into groups (734-0 to -n), where each group includes a different row of NVSRAM cells. Control signals and voltages (VCCTx/VCLRx/VSEx/VSTRx, where x corresponds to a group) can be generated by corresponding control circuits (718-0 to -n).

In the particular embodiment shown, control circuits (718-0 to -n) can drive their respective control signal/voltages based on mode selection signals (Mode0 to Moden). In one embodiment, Write to SRAM, Store, Recall and Verify operations can be performed on a row-wise basis, accessing NVSRAM cells of one group. However, a hardening operation can occur in multiple groups (734-0 to -n). In the particular embodiment shown, control circuits (718-0 to -n) can drive their respective control signals/voltages to the hardening levels in response to signal HRD. Thus, a hardening operation can place NVSRAM cells of an entire array into the hardened state, allowing subsequent high reliability reads from any NVRAM cells within the array.

It is noted that in some embodiments, one portion of a memory device may have different hardening options than others. As but one very particular example, a memory device can include a region (e.g., sector, block) that may always operate in a hardened state, while other regions may be selectively placed into a hardened state.

Figure 8A:
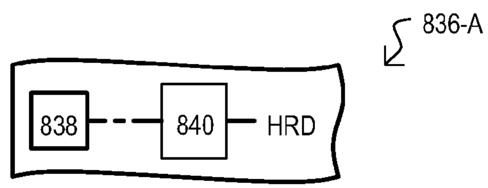
FIGS. 8A and 8B are mode inputs that can be included in embodiments.
Figure 8B:
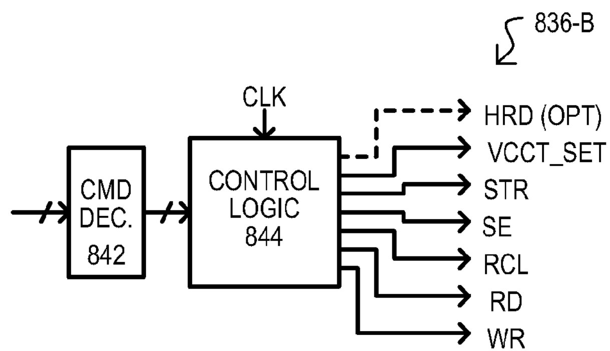

FIGS. 8A and 8B show various mode inputs that can establish a hardened mode according to embodiments. As noted above, a hardened mode can be established in a dynamic fashion, by way of one or more inputs to a memory device, or may be established in a static fashion (i.e., all or a portion of the memory device are always in a hardened state).

FIG. 8A shows a mode input 836-A that may take various forms. FIG. 8A shows an IC connection 838 and a mode setting circuit 840. An IC connection 838 can be a physical connection for an integrated circuit device, such as a bond pad, pin, ball, bump, lead, etc. In some embodiments, mode setting circuit 840 can provide for dynamic enabling of memory cell hardening. In one embodiment, a mode setting circuit 840 can be an input buffer circuit that generates a hardened mode signal (HRD) by buffering an input signal. In other embodiments, a mode setting circuit 840 can provide a static enabling of a hardened mode. For example, a mode setting circuit 840 can include a fusible link, programmable nonvolatile elements, metal option, bond option, or other suitable static feature that establishes a static signal to establish the hardened mode.

FIG. 8B shows a mode input 836-B that establishes a hardened mode with command decoding. A mode input 836-B can be part of a larger command decoding circuit that includes a command decoder 842 and control logic 844. A command decoder 842 can decode input signals, and in response, provide inputs to control logic 844 that indicate a type of operation being performed. In some embodiments, a command decoder 842 can receive common SRAM input signals, such as an output enable signal /OE, a write enable signal /WE, and a chip enable signal ICE. In a very particular embodiment, a command decoder 842 can also receive one or more inputs that indicate nonvolatile operations. As but one example, a STORE signal, or the like can be received to initiate a store operation (i.e., transfer of latched data to nonvolatile elements).

Control logic 844 can activate control signals and voltages for NVSRAM cells to execute operations as described herein, or equivalents. In the embodiment shown, control logic can generate: a VCCT_SET signal, which can establish a supply voltage (e.g., VCCT) for nonvolatile sections; signals STR, SE and RCL, which can activate VSTR, VSE and VRCL signals as described herein, or equivalents; a signal RD which can indicate a read operation (which can be either a standard read or high reliability read depending upon whether the memory cells are in a hardened state); and a signal WR which can indicate a write to SRAM operation.

Optionally, control logic 844 can activate a signal HRD, which can indicate a hardened mode of operation (e.g., set all, or portions of the memory cells into the hardened state). Alternatively, hardened modes of operation can be established by individual activation of control signals (i.e., STR, SE, RCL).

In the embodiment shown, all or a portion of the control signals can be activated according to a timing established by a clock signal CLK.

Figure 9:
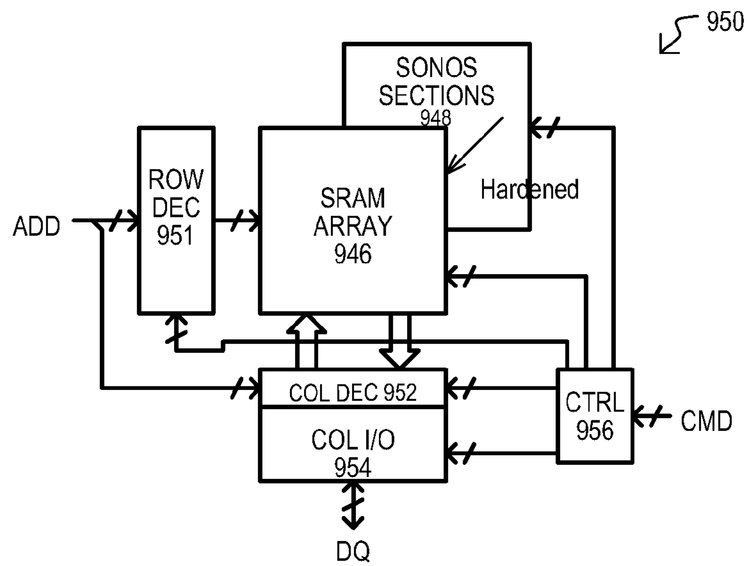
FIG. 9 is a block schematic diagram of a memory device having a parallel interface according to an embodiment.

FIG. 9 shows a memory device 950 according to another embodiment. A memory device 950 can provide access to NVSRAM cells via a parallel interface.

A memory device can include an SRAM array portion 946, a nonvolatile section 948, row decoder 951, column decoder 952, an input/output section 954 and a control section 956. An SRAM array portion 946 can include latch and access portions of NVSRAM memory cells. In some embodiments, an SRAM array portion 946 can include six-transistor (6-T) SRAM cells. However, in other embodiments, an SRAM array section can include SRAM cells other than 6-T cells. A nonvolatile section 948 can include nonvolatile sections, as described herein, or equivalents. In the embodiment shown, nonvolatile section 948 can include SONOS type transistors. In a hardened mode operation, nonvolatile section 948 can be connected to SRAM array portion 946 to enable high reliability storage and read operations, as described herein, or equivalent.

A row decoder 950 and column decoder 952 can decode address values to select rows and columns of NVSRAM cells (946/948) for read and write operations. In some embodiments, row/column decoders (950/952) can also select NVSRAM cells (946/948) for store, recall, and/or harden operations.

An input/output section 954 can enable data paths between an input/output (DQ) of the device and selected columns of NVSRAM cells (946/948), to thereby enable parallel data transfers. While FIG. 9 shows a bi-directional data bus, in an alternate embodiment write data can be input on a separate data bus than that which outputs read data.

A control section 956 can generate controls signals for executing various operations in the memory device 950, including but not limited to: Reads (both standard and high reliability), Writes, Store, Recall and Hardening It is noted that in one embodiment, a memory device 950 can be a synchronous device, executing operations in synchronism with a periodic timing clock. However, in an alternate embodiment, a memory device 950 can be asynchronous, executing operations in response to input signals (e.g., transitions in address values, ADD).

Figure 10:
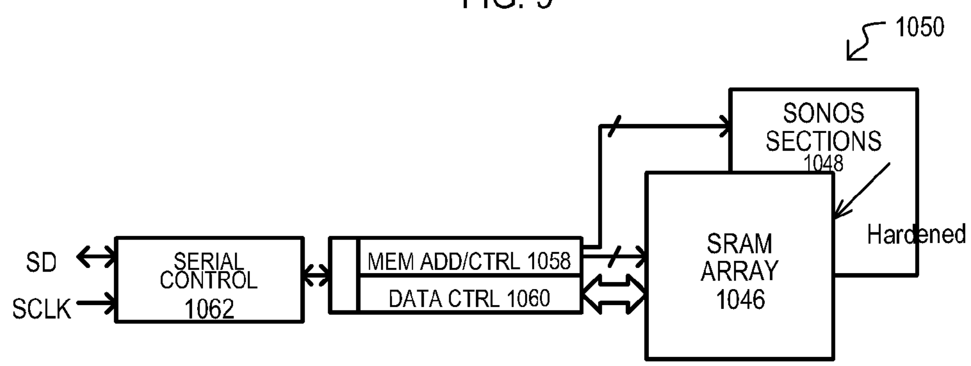
FIG. 10 is a block schematic diagram of a memory device having a serial interface according to an embodiment.

FIG. 10 shows a memory device 1050 according to another embodiment. A memory device 1050 can provide access to NVSRAM cells via a serial interface.

A memory device can include an SRAM array portion 1046, a nonvolatile section 1048, row decoder 1050, a memory address/control section 1058, a data control section 1060, and a serial control section 1062.

An SRAM array portion 1046 and nonvolatile section 1048 can have a structure like that noted for FIG. 9.

A serial control section 1062 can receive and transmit data in a serial data stream. Incoming serial data can include command, address and write data. Outgoing serial data can include read data. In the particular embodiment shown, serial control section 1062 can include a serial data input/output (SD) and a timing clock SCLK. However, in other embodiments, a data clock can be extracted from the incoming serial data stream.

Memory address/control section 1058 and a data control section 1060 can generate control signals and data to executing various operations in the memory device 1050, including but not limited to: Reads (both standard and high reliability), Writes, Store, Recall and Hardening.

While embodiments can include memory devices as described herein, other embodiments can include systems incorporating such memory devices. Particular system embodiments will now be described.

Figure 11:
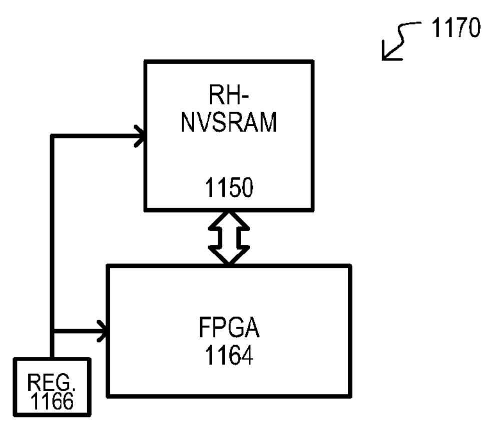
FIG. 11 is a block schematic diagram of a system according to an embodiment.

FIG. 11 shows a system 1170 according to an embodiment. A system 1170 can include a high reliability (e.g., rad hard, RH) NVSRAM device 1150, a programmable logic device (in this embodiment, a field programmable gate array, FPGA)

1164, and a voltage regulator 1166. A RH-NVSRAM device 1170 can be a memory device that stores data using NVSRAM type cell having a hardened mode of operation as described herein, or equivalents. A RH-NVSRAM device 1170 can be formed in a single integrated circuit package. As will be described in more detail below, in some embodiments, a RH-NVSRAM device 1170 can include one IC die, while in other embodiments can be a multi-chip type module, containing more than one IC die.

An FPGA 1164 can be programmed to provide functions according to configuration data stored within RH-NVSRAM device 1170. A voltage regulator 1166 can regulate supply voltages to the devices of the system 1170.

A comparison between FIG. 11 and FIG. 15 shows that a single RH-NVSRAM device 1170 can replace eight devices of a conventional solution like that of FIG. 15. RH-NVSRAM devices that employ SONOS type transistors as nonvolatile elements can provide a standalone memory solution for high-reliability applications (e.g., space). A SONOS type transistor can be radiation hardened by design (as contrasted to poly-silicon based floating gate technologies typically found in flash memory devices). Such an NVSRAM device can include a SONOS device for quantum based storage to bolster an SRAM latching portion, which might otherwise be weak with respect to radiation resistance. By biasing nonvolatile sections (e.g., SONOS device stacks) the SRAM latch circuit performance is improved, providing a radiation hardened device.

Accordingly, in a system 1120 like that of FIG. 11, redundancy can be eliminated or greatly reduced, as compared to a conventional system, like that of FIGS. 15 and/or 16.

Figure 12:
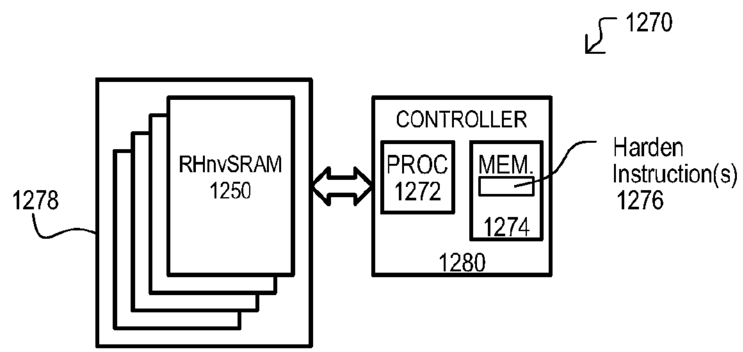
FIG. 12 is a block schematic diagram of a system according to another embodiment.

FIG. 12 shows a system 1270 according to another embodiment. A system 1270 can include a memory section 1278 and a controller section 1280. A memory section 1278 can include multiple RH-NVSRAM devices 1250 (one shown as 1250) as descried herein, or equivalents.

A controller section 1280 can include a processor 1272 and a memory 1274. A processor 1272 can execute instructions stored in memory 1274. In the embodiment shown, memory 1274 can include hardening instructions 1276 executable by processor to place all or portions of memory section into a hardened state. Instruction data stored in memory 1274 can be loaded from memory section 1278. A controller section 1208 can be formed of radiation hardened devices and/or can include radiation shielding.

Figure 13A:
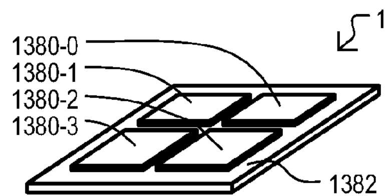
FIGS. 13A and 13B are diagrams showing memory modules according to embodiments.
Figure 13B:
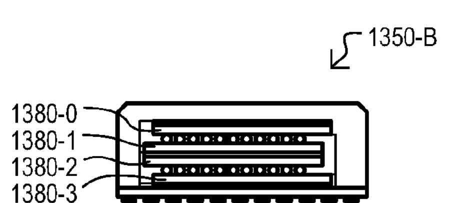

FIGS. 13A and 13B show memory devices according to particular embodiments.

FIG. 13A shows a multi-chip module 1350-A in a perspective view. Multiple RH-NVSRAM ICs 1380-0 to -3 (in this example, four) can be formed on a substrate 1382 that can include conductive traces and package connections. RH-NVSRAM ICs 1380-0 to -3 can be memory ICs having NVSRAM cells that can be hardened as described herein, or an equivalent.

It is noted that the RH-NVSRAM ICs (1380-0 to -3) can be subsequently covered with a protective structure.

FIG. 13B shows another multi-chip module 1350-B in a side cross sectional view. Multiple RH-NVSRAM ICs 1380-0 to -3 (in this example, four) can be stacked within a same package, and connected to one another via conductive interconnects. Conductive interconnects can also be connected to package connections (one shown as 1384.

Figure 14:
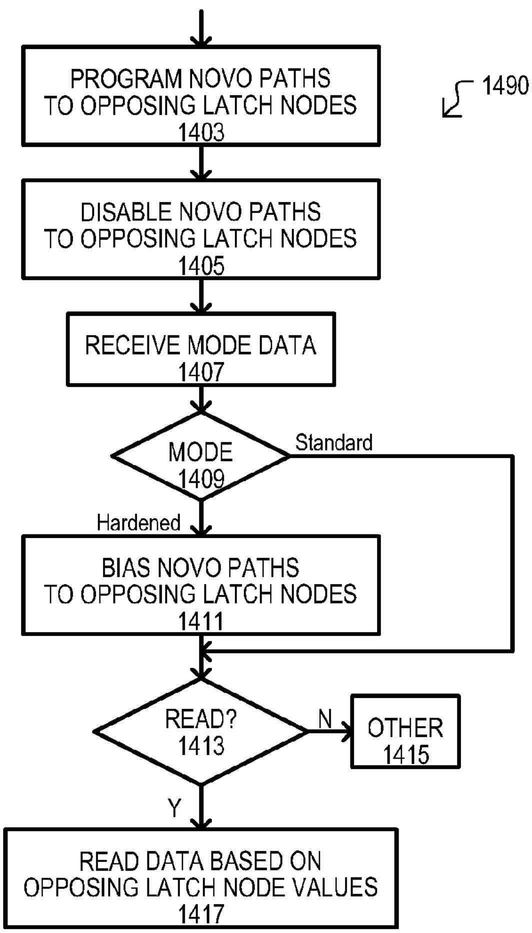
FIG. 14 is a flow diagram of a method according to an embodiment.

FIG. 14 is a flow diagram of a method 1490 according to an embodiment. A method 1490 can include programming nonvolatile (novo) paths to opposing latch nodes (1403). Such an action can include programming nonvolatile elements in different stacks to opposing states (e.g., high impedance and low impedance). In some embodiments, nonvolatile elements can be programmed based on data stored by latches. In a very particular embodiment, such an action can include programming SONOS type transistors to high and low threshold voltages.

Method 1490 can include disabling novo paths to opposing latch nodes (1405). Such an action can include electrically isolating nonvolatile elements from latch nodes using switch devices or the like.

Mode data can then be received (1407). Mode data can indicate one or more particular operations, including a high reliability (hardened) mode. Mode data can be generated according to any suitable technique, including but not limited to command data, a dedicated input signal, or a configuration circuit, as but a few examples.

If mode data indicates a standard mode of operation (Standard from 1409), a method can continue to a standby state and wait for a command (go to 1413).

If mode data indicates a hardened mode (Hardened from 1409), a method 1490 can bias novo paths to opposing latch nodes (1411). Such an action can include selectively creating a current path between a latch node and a supply voltage based on a state of a nonvolatile element. In one very particular embodiment, such an action can include applying a gate-to-source voltage to SONOS type transistors programmed to different threshold voltages.

If a non-read command is received (N from 1413) a method 1490 can execute actions suitable for the command (shown as other 1415).

If a read command is received (Y from 1413), data can be read based on opposing latched node values (1417). Such actions can include single ended or differential reads from latch data nodes of NVSRAM cells. It is understood that if the device was in the hardened mode (Hardened from 1409), such data nodes can be biased according to nonvolatile element states during the read operation. However, if the device is in a standard mode of operation (Standard from 1409), data nodes not biased by novo stacks, but maintained by a latch circuit.

Embodiments can provide a radiation hardened non-volatile memory solution that can have a smaller size, consume less power, and be less complex than conventional approaches like those of FIGS. 15 to 17.

In very particular embodiments, multiple NVSRAM ICs can be combined to provide large nonvolatile storage for systems. In a very particular embodiment, four 16 Mbit NVSRAM ICs can be stacked to provide a dense (64 Mbit) radiation hardened non-volatile memory solution.

In very particular embodiments, NVSRAM cells can employ the SONOS technology of Cypress Semiconductor Corporation of San Jose, Calif. U.S.A.

While embodiments above have shown SONOS type non-volatile elements, alternate embodiments can utilize different types of nonvolatile elements, such as transistors employing floating gates, it being understood that such non-SONOS devices may not have as high a radiation resistance as SONOS devices.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A device, comprising:

a plurality of memory cells, each memory cell including at least one latch circuit coupled between two data nodes, a first nonvolatile section coupled to a first data node, and a second nonvolatile section coupled to a second data node; and each nonvolatile section including at least one switch element in series with a programmable nonvolatile element, the switch element configured to couple the nonvolatile element to the corresponding data node during a high reliability read operation of the memory cell.

2. The device of claim 1, wherein:

each nonvolatile element comprises a semiconductor-oxide-nitride semiconductor (SONOS) type transistor having a charge trapping insulating layer between a control gate and a channel.

3. The device of claim 2, wherein:

each nonvolatile section includes a first switch transistor having a source-drain path coupled between the respective data node and the SONOS type transistor, and a second switch transistor having a source-drain path coupled between the SONOS type transistor and the first supply voltage.

4. The device of claim 3, further including:

a control circuit configured to, in the high reliability read operation, activate a first control signal to place the first switch transistors of a group of memory cells into a low impedance state, a second control signal to place the second switch transistors of the group of memory cells into a low impedance state, and a third control signal to place the SONOS type transistors into an impedance state that varies according to a programmed state of the SONOS type transistors.

5. The device of claim 1, wherein:

each nonvolatile element comprises a floating gate type transistor having a charge trapping floating gate layer between a control gate and a channel.

6. The device of claim 1, wherein:

the at least one switch element is configured to isolate the nonvolatile element from the corresponding data node during a standard read operation of the memory cell.

7. The device of claim 1, further including:

a mode setting circuit that activates a mode signal to enable the high reliability read operation.

8. The device of claim 7, wherein:

the mode setting circuit includes a circuit element selected from: a fusible link, a metal option, a buffer circuit, a bond option, and a command decoder configured to generate the mode signal in response to a predetermined combination of input signals.

9. The device of claim 1, wherein:

each memory cell further includes at least a first access device coupled between one of the data nodes and a first bit line, and configured to provide a low impedance in at least the high reliability read operation.

10. The device of claim 1, wherein:

each nonvolatile section is configured to act as a current leaker device, providing current to its corresponding data node when the data node voltage changes by a predetermined amount.

11. The device of claim 1, wherein:

each nonvolatile section increases the capacitance of its corresponding data node over the capacitance provided by the latch circuit.

12. A device, comprising:

at least one memory integrated circuit (IC) device having an array of memory cells, each memory cell including a latch coupled between first and second data nodes, and first and second nonvolatile sections configured to couple first and second nonvolatile programmable elements between the first and second data nodes, respectively, in a high reliability read operation; and at least one input to enable the high reliability read operation.

13. The device of claim 12, wherein:

the nonvolatile programmable elements are selected from the group of: semiconductor-oxide-nitride-semiconductor (SONOS) type transistors having a charge trapping insulating layer between a control gate and a channel, and floating gate type transistors having a charge trapping floating gate between a control gate and a channel.

14. The device of claim 12, wherein:

the at least one input is selected from: a command decoder input, an IC input, a one-time programmable memory element, and a re-programmable memory element.

15. The device of claim 12, wherein:

the first and second nonvolatile sections are further configured to isolate the first and second nonvolatile programmable elements from the first and second data nodes in a standard read operation.

16. A method, comprising:

a cell harden operation that couples programmable nonvolatile elements to complementary data nodes of latches within memory cells; and a high reliability read operation that reads data from the complementary data nodes after the cell harden operation.

17. The method of claim 16, wherein:

the nonvolatile elements comprise semiconductor-oxide-nitrideoxide-semiconductor (SONOS) type transistors having a charge trapping insulating layer between a control gate and a channel, each SONOS type transistor being programmable between at least a first and second threshold voltage; and the cell harden operation includes applying a gate-to-source voltage to the SONOS type transistors that is between the first and second threshold voltages.

18. The method of claim 16, further including:

prior to the cell harden operation, executing a store operation that includes storing write data in the latches, and programming the nonvolatile elements based on the write data stored by the latches.

19. The method of claim 18, further including:

after the store operation, executing a recall operation that includes establishing states of the latches according to the programmed states of corresponding nonvolatile elements, outputting read data based on the data stored by the latches, and comparing the read data to the write data to verify the nonvolatile elements are programmed with the write data.

20. The method of claim 16, wherein including: the cell harden operation includes enabling the cell harden operation in response to an action selected from the group of: establishing a voltage with a programmable nonvolatile memory element, a metal option of an integrated circuit (IC), a fusible link, an IC bonding option; and decoding an input command to an IC device.

* * * * *